United States Patent [19]

Kakimoto et al.

[11] Patent Number: 4,855,014

[45] Date of Patent: Aug. 8, 1989

[54] METHOD FOR MANUFACTURING SEMICONDUCTOR DEVICES

[75] Inventors: Seizo Kakimoto, Tenri; Jun Kudo; Masayoshi Koba, both of Nara, all of Japan

[73] Assignee: Sharp Kabushiki Kaisha, Osaka, Japan

[21] Appl. No.: 6,363

[22] Filed: Jan. 23, 1987

[30] Foreign Application Priority Data

Jan. 24, 1986 [JP] Japan .................. 61-14267

[51] Int. Cl.$^4$ .................. C30B 1/08; C30B 13/06
[52] U.S. Cl. .................. 156/620.72; 156/603; 156/610; 156/613; 156/620.7; 156/DIG. 64; 156/DIG. 73; 156/DIG. 80; 156/DIG. 87; 156/DIG. 102; 427/53.1
[58] Field of Search .............. 156/603, 610, 613, 616, 156/617 R, DIG. 64, DIG. 73, DIG. 80, DIG. 87, DIG. 102, 620.7, 620.72; 427/53.1; 437/241

[56] References Cited

U.S. PATENT DOCUMENTS

| | | | |
|---|---|---|---|
| 4,352,835 | 10/1982 | Holbrook et al. | 427/53.1 |
| 4,371,421 | 2/1983 | Fan et al. | 156/DIG. 88 |
| 4,534,820 | 8/1985 | Mori et al. | 156/DIG. 64 |
| 4,545,823 | 10/1985 | Drowley | 148/1.5 |
| 4,589,951 | 5/1986 | Kawamura | 156/DIG. 102 |
| 4,655,850 | 4/1987 | Katimoto et al. | 427/53.1 |
| 4,674,176 | 6/1987 | Tuckerman | 427/53.1 |

FOREIGN PATENT DOCUMENTS

| | | | |
|---|---|---|---|
| 0167391 | 2/1985 | European Pat. Off. | 156/603 |
| 1592287 | 5/1970 | France | 156/613 |
| 58191450 | 9/1985 | Japan | 156/610 |
| 6247680 | 11/1986 | Japan | 156/617 R |

OTHER PUBLICATIONS

Colinge et al., Use of Selective Annealing for Growing Very Large Grain Soi Films, Applied Physics, Letters, 44(4) Aug. 15, 1982, pp. 346–347.
Sakurai et al., Laser–Induced Lateral Eritaxial Growth of Silicon Over Silicon Dioxide, Applied Physics Letters, Jul. 1, 1982, 41(1) pp. 64–66.
T. Inoue et al., "Electron–Beam Recrystallized Polysilicon . . . ," *Microelectronics Journal*, 14 (1983) Nov.–Dec., No. 6, pp. 74–81.
H. Ishiwara et al., "Recrystallization of silicon-on-Insulator . . . ", *Jap. Journal of Appl. Physics*, vol. 24, No. 2, Feb., 1985, pp. 126–132.
K. Suguro et al., "Seeding Lateral Epitaxy of Silicon . . . ," *Appl. Phys. Lett.*, 47(1985) Oct., No. 7, pp. 695–699.

*Primary Examiner*—John Doll
*Assistant Examiner*—Robert M. Kunemund
*Attorney, Agent, or Firm*—Birch, Stewart, Kolasch & Birch

[57] ABSTRACT

Disclosed is a method of manufacturing semiconductor devices, in which a monocrystalline thin film is formed by dissolving and recrystallizing either amorphous or polycrystalline thin film by annealing with energy beams, comprising the steps of: forming a compound film of a belt-shaped high melting point metal having a width narrower than the diameter of said energy beams and polycrystalline silicon, on said amorphous or polycrystalline thin film; causing said amorphous or polycrystalline thin film to contact with a monocrystalline substrate beneath the center line of said belt-shaped compound film at a position of more than 50 to 200 μm remote from the end of the belt-shaped compound film in the scanning direction of said energy beams, with the contact shape being a tiny spot narrower than the width of the belt-shaped compound film; radiating said energy beams, penetrating through said belt-shaped compound film to scan parallel to the belt, starting from the vicinity of the end of the belt-shaped compound film, and inducing crystal growth of the amorphous or polycrystalline thin film beneath the belt-shaped compound film, starting from the monocrystals inheriting the crystalline configuration of the monocrystalline substrate developed by epitaxial growth from the monocrystalline substrate in the amorphous or polycrystalline thin film contacting with the monocrystalline substrate near the end of the belt-shaped compound film.

It is more preferable to compose so that the upper surface of the amorphous or polycrystalline thin film contacting with the monocrystalline substrate may be flush with the upper surface of the amophous or polycrystalline thin film not contacting with the monocrystalline substrate near this contacting portion.

13 Claims, 3 Drawing Sheets

(TEMPERATURE DISTRIBUTION)

METHOD FOR MANUFACTURING SEMICONDUCTOR DEVICES

BACKGROUND AND SUMMARY OF THE INVENTION

This invention relates to a method of manufacturing semiconductor devices, more particularly, to a method of manufacturing semiconductor devices by radiating energy beams such as electron beams to an amorphous or polycrystalline thin film to dissolve and recrystallize said thin film so as to promote the crystal growth of the amorphous or polycrystalline thin film to for development into a monocrystalline configuration.

Recently, the technology of monocrystallizing a thin film formed as amorphous or polycrystalline thin film and using said film as a substrate for a semiconductor has been intensively studied.

It is hence a primary object of this invention to present a method of manufacturing semiconductor devices capable of monocrystallizing an amorphous or polycrystalline thin film easily, so as to reduce the damage of the formed monocrystals being excellent in uniformity as compared with the conventional methods.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

This invention relates to a method of manufacturing semiconductor devices which includes forming thin film monocrystals by dissolving and recrystallizing an amorphous or polycrystalline thin film by annealing using energy beams. A compound film of belt-shaped high melting point metal having electron absorbing properties and a smaller width than the energy beams, and polycrystalline silicon are formed on the amorphous or polycrystalline thin film. Under the center line of the belt-shaped compound film at a position more than 50 to 200 μm remote from the end of this belt-shaped compound film in the scanning direction of the energy beams, said amorphous or polycrystalline thin film is caused to contact a monocrystalline substrate. This contact shape is a tiny spot narrower than the width of the belt-shaped compound film, and energy beams are radiated, penetrating through this belt-shaped compound film, and the beams scan parallel to the belt, starting from the point near the end of the belt-shaped compound film. Then the amorphous or polycrystalline thin film beneath the belt-shaped compound film is crystallized from the monocrystals, inheriting the crystalline configuration of the monocrystalline substrate developed by epitaxial growth from the monocrystalline substrate in the armophous or polycrystalline thin film contacting the monocrystalline substrate near the end of belt-shaped compound film.

In carrying out this invention, it is preferable to form the upper surface of the amorphous or polycrystalline thin film in the portion contacting with the monocrystalline substrate so that it is flush with the upper surface of the amorphous or polycrystalline thin film not in contact with the monocrystalline substrate near this contacting portion.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE PREFERRED EMBODIMENTS

Monocrystallization may be achieved by providing an amorphous or polycrystalline thin film with energy by radiating with laser beams, electron beams or the like to dissolve it once, and controlling the temperature distribution and the nucleus generating position when this dissolved portion is solidified.

Figure 1:
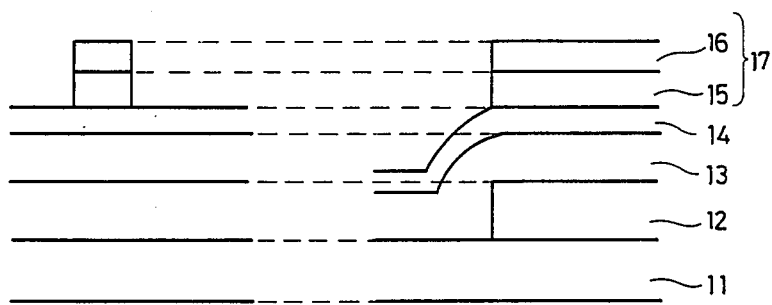
FIG. 1 and FIG. 2 are sectional views of the substrate to explain the basic idea of the method of manufacturing semiconductor devices of this invention.

Referring now to FIG. 1 which is a sectional view of the substrate to illustrate the basic idea of this monocrystallization method, a monocrystalline substrate 11 made of silicon or other material is used as a support stand, and an insulation film 12 made of $SiO_2$, $Si_3N_4$ or similar material is formed on the surface of this monocrystalline substrate 11, and a polycrystalline silicon film 13 for monocrystallizing is formed on the surface of this insulation film 12, while an insulation film made of $SiO_2$, $Si_3N_4$ or similar material is formed on the surface of this polycrystalline silicon film 13, a polycrystalline silicon film 15 and a belt-shaped compound film 17 of a high melting point metal film 16 made of molybdenum (Mo), tungsten (W) or other material are formed on the surface of this insulation film 14. At this time, the width of this belt-shaped compound film 17 is smaller than the diameter of electron beams, and it is set, for example, at 10 to 20 μm.

The substrate composed of such a laminate structure is irradiated with electron beams to be provided with energy to monocrystallize a polycrystalline region 13.

At both sides of the belt-shaped compound film 17, the electron beams heat the moncrystalline silicon film 13 only through the insulation film 14, but beneath the compound film 17, since the electron reflectivity and inhibiting ability of the high melting point metal film 16 are high, the energy of the electron beams is decreased by reflection, and it is fully absorbed within the thin film 17 so that the thin film 17 itself rises in temperature, and this heat is conducted to heat the thin film 13.

Figure 4:
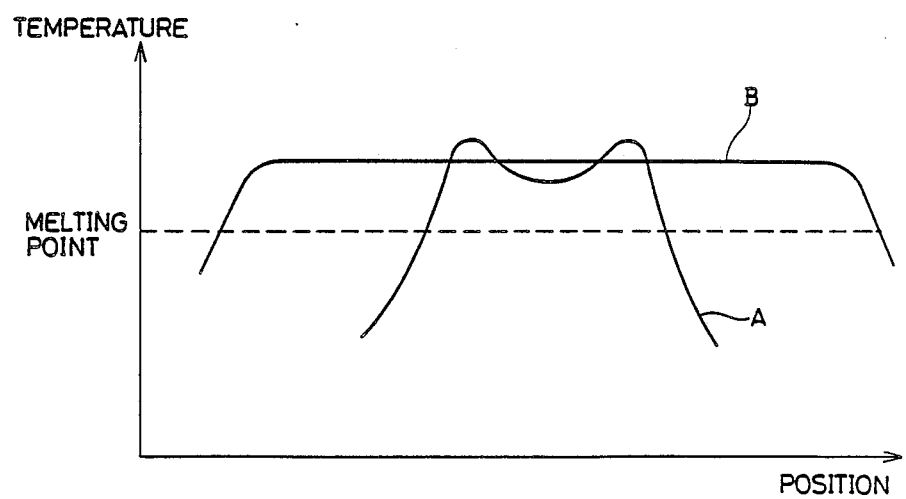
FIG. 4 is a temperature distribution diagram in an annealing process.

Therefore, the belt-shaped compound film 17 arrests temperature rise of the amorphous thin film 13 to produce a temperature profile lower in the middle of the dissolved portion than in the peripheral portions as indicated by curve A in FIG. 4. Therefore, in the stage of dissolving and recrystallizing, it serves to present a solid-liquid boundary shape and nucleus generating position suited to monocrystallization. At this time, the polycrystalline silicon film 15 alleviates the thermal stress occurring between the insulation film 14 and the high melting point metal film 16 at the time of heating.

In the method of manufacturing semiconductor devices shown in FIG. 1, the films are designed so that the polycrystalline silicon film 13 is in a portion not covered by the belt-shaped compound film 17 near the end of the belt-shaped compound film 17 which is the starting point of monocrystallization. The film 13 is caused to contact the monocrystalline substrate 11 directly, and the polycrystalline silicon film 13 beneath the belt-shaped compound film 17 grows in a process of crystallization from the seeds of the monocrystals having the same crystalline configuration as the monocrystalline substrate 11 developed by epitaxial growth from the monocrystalline substrate 11 in that portion, and the monocrystals are formed so that the configuration may be same as that of the substrate 11.

Figure 2:
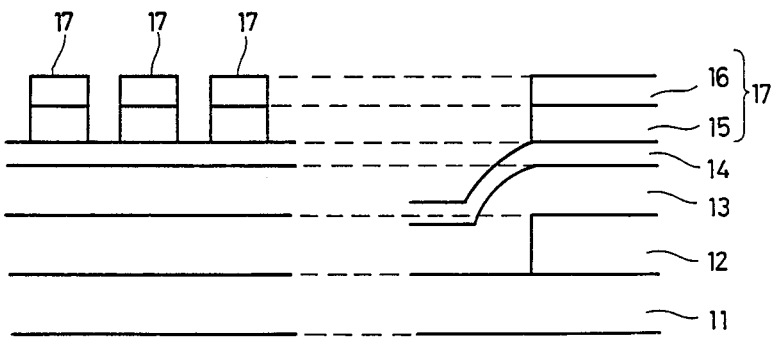

FIG. 2 is a sectional view of the substrate in another embodiment applying the same method of manufacturing semiconductor devices, in which the compound film 17 is patterned in the shape of a line and spaces, the film having a width of about 10 μm to 20 μm, and the space width being about 5 μm. When a plurality of electron beam absorbing films 17 are simultaneously annealed by triangular wave deflection pseudoline beams having a flat energy distribution as indicated by characteristic curve B in FIG. 4, the temperature distribution is controlled by the electron beam absorbing films 17 in the same manner as in the case shown in FIG. 1, and a plurality of monocrystalline regions are formed. Since the width of the monocrystalline regions is greater than that of the belt-shaped compound film 17, the monocrystalline regions are linked by forming the line-and-space pattern using the values designated above, and the crystalline configuration of the monocrystalline regions is the same as that of the monocrystalline substrate 11 as in FIG. 1, so that crystalline boundary is not formed between adjacent monocrystals. As a result, a large-area monocrystal nearly the same in width as the pseudoline electron beam is formed.

The basic idea of this invention is as stated above. In this method, however, as a result of various investigations, it has been found that the configuration and shape of the amorphous or polycrystalline thin film in the portion contacting the monocrystalline substrate in relation with the belt-shaped compound film are disadvantageous so as to damage the formed monocrystals and greatly affect the uniformity of the crystals, which results in poor reproducibility.

For example, in the composition shown in FIG. 1, when the polycrystalline silicon in the portion contacting with the monocrystalline substrate 11 is formed in a linear shape perpendicular to the belt-shaped compound film which runs across the belt-shaped compound film 17, the surface area is large in the portion contacting the monocrystalline substrate 11 which is high in heat conduction, while the belt-shaped compound film 17 is not provided on the polycrystalline silicon film 13 in the contacting portion, and this film thickness is same as that of the polycrystalline silicon film 13 not contacting the monocrystalline substrate 11 near this contacting portion. The heat capacity of the polycrystalline silicon in this contacting portion is smaller than that of the amorphous or polycrystalline thin film not contacting the monocrystalline substrate 11 around that portion, and therefore when dissolved and recrystallized by energy beams, since this portion contacts the monocrystalline substrate 11 which is higher in thermal conductivity, the heat conduction is great. Moreover, since the heat of this portion is small, the temperature difference becomes excessive between the polycrystalline silicon film 13 in this portion and the polycrystalline silicon film 13 not contacting with the monocrystalline substrate 11 near that portion. In this state, if an energy sufficient to dissolve the polycrystalline silicon film 13 at this contacting portion is given through the energy beams, damage such as scattering and reduction of the film thickness occur in the polycrystalline silicon 13 near the contacting portion, and the crystalline configuration of the formed monocrystals is likely to be deviated by this damage, and the uniformity of the formed monocrystals is decreased.

This invention is created in the light of this point, and the basic plan of the method of manufacturing semiconductor devices is improved, and is intended to present a method of manufacturing semiconductor devices capable of monocrystallizing the amorphous or polycrystalline thin film easily and reducing damage to the formed monocrystals which have excellent uniformity, as compared with the conventional methods.

To achieve this object, this invention presents a method of fabricating semiconductors by annealing an amorphous or polycrystalline thin film by energy beams so as to dissolve and recrystallize, and forming thin layer monocrystals, in which a compound film of an electron-absorbing belt-shaped high melting point metal having a width narrower than the energy beams and polycrystalline silicon is formed on the amorphous or polycrystalline thin film, and under the center line of the belt-shaped compound film at a position more than 50 to 200 μm remote from the end of this belt-shaped compound film in the scanning direction of energy beams, said amorphous or polycrystalline thin film is caused to contact a monocrystalline substrate. This contact shape is a tiny spot narrower than the width of the belt-shaped compound film, and energy beams are radiated, penetrating through this belt-shaped compound film, and the beams scan parallel to the belt, starting from the point near the end of the belt-shaped compound film. Then the amorphous or polycrystalline thin film beneath the belt-shaped compound film is crystallized from the monocrystals, inheriting the crystalline configuration of the monocrystalline substrate developed by epitaxial growth of the monocrystalline substrate in the amorphous or polycrystalline thin film contacting the monocrystalline substrate near the end of belt-shaped compound film.

In carrying out this invention, it is preferable to compose the upper surface of the amorphous or polycrystalline thin film in the portion contacting the monocrystalline substrate so as to flush with the upper surface of the amorphous or polycrystalline thin film not in contact with the monocrystalline substrate near this contacting portion.

When dissolving and recrystallizing the amorphous or polycrystalline thin film beneath the belt-shaped compound film, the position of the contacting portion of the monocrystalline substrate and the amorphous or polycrystalline thin film is more than 50 to 200 μm remote from the end of the belt-shaped compound film in the scanning direction, so that the energy beams may reach the amorphous or polycrystalline thin film in the portion contacting with the monocrystalline substrate after heating caused by the energy beams reaches a stationary state when starting the scanning by energy beams from near the end of the belt-shaped compound film, thereby heating the amorphous or polycrystalline thin film in this contacting portion. At the same time, the position of the amorphous or polycrystalline thin film in the contacting portion is beneath the center line of the belt-shaped compound film, and its shape is a tiny spot narrower than the width of the belt-shaped compound film, and also the upper surface of the amorphous or polycrystalline thin film in the contacting portion is flush with the upper surface of the amorphous or polycrystalline thin film in the portion not contacting with the monocrystalline substrate near said contacting portion, so that the heat capacity of the amorphous or polycrystalline thin film in the contacting portion and its upper part may be large. By decreasing the surface area contacting the monocrystalline substrate having a large heat conduction, the heat flowing in the monocrystalline substrate becomes smaller, which facilitates temperature rise of the amorphous or polycrystalline thin film in the contacting portion when dissolving and recrystallizing. As a result, the temperature difference from the amorphous or polycrystalline thin film not contacting the monocrystalline substrate near the contacting portion becomes small, and when a sufficient energy for dissolving the amorphous or polycrystaline thin film in the contacting portion is given, occurrence of damage of the monocrystals due to excessive rise of the temperature in the amorphous or polycrystalline thin film not contacting with the monocrystalline substrate near the contacting portion may be prevented, so that decline of uniformity due to deviation of crystalline configuration derived from such damage may be suppressed.

In the embodiment of this invention as described below, the sample structure is as follows. That is, part of the amorphous thin film for monocrystallizing is caused to contact the monocrystalline substrate, and the entire surface of this amorphous thin film is covered with a relatively thin insulation film acting as protective film. Also starting from the vicinity of the contacting portion of the amorphous thin film and the monocrystalline substrate, a belt-shaped compound film of high melting point metal such as molybdenum (Mo) and tungsten (W) and polycrystalline silicon narrower than the diameter of electron beams is laminated, and a sample substrate is prepared.

At this time, the position of the amorphous thin film contacting with the monocrystalline substrate is 50 to 200 μm distant from the end of the belt-shaped compound film in the scanning direction of the beams and beneath the center line of the belt-shaped compound film, and its shape is a tiny spot smaller than the width of the belt-shaped compound film. The upper surface of the amorphous thin film in the contacting portion is flush with the upper surface of the amorphous thin film not contacting the monocrystalline substrate near this contacting portion, so that the temperature rise of the amorphous thin film in the contacting portion is facilitated and so that the temperature difference from the amorphous thin film not contacting with the monocrystalline substrate but near the contacting portion is reduced. Therefore, when a sufficient energy for dissolving the amorphous thin film in the contacting portion is applied, the occurrence of damage to the monocrystals due to an excessive rise of the temperature in the amorphous thin film not contacting the monocrystalline substrate near the contacting portion may be prevented, so that a decline of uniformity due to a deviation of crystalline configuration derived from such damage may be suppressed.

By irradiating this substrate with electron beams, a temperature distribution optimum for monocrystalline growth is created in the same method as stated above, and by causing the amorphous thin film to contact the monocrystalline substrate at the starting point of the formation of monocrystals near the end part beneath the belt-shaped compound film, monocrystals are formed in the same crystalline configuration as in the substrate at the time of crystal growth of the amorphous thin film beneath the belt-shaped compound thin film, starting from the monocrystals in the same crystalline configuration as in the monocrystalline substrate generated by the epitaxial growth from the monocrystalline substrate in that portion.

Figure 3:
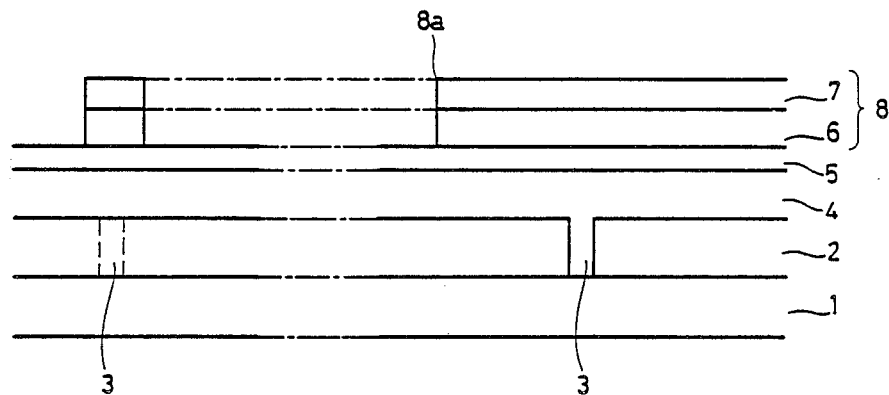
FIG. 3 is a sectional view of the substrate to explain one of the embodiments of this invention.

FIG. 3 is a sectional view of the substrate to explain another embodiment of this invention, in which the section in the orthogonal direction is indicated on the right and left. The right side of FIG. 3 indicates the vicinity of the starting point of energy beam scanning near the end of the belt-shaped compound film.

In FIG. 3, an insulation film 2 made of $SiO_2$, $Si_3N_4$ or similar material is formed on a monocrystalline substrate 1 made of silicon or other material, and an opening 3 to trigger epitaxial growth from the substrate at the time of dissolving and recrystallizing is provided in part of this insulation film 2, and an opening seed is formed by exposing the substrate 1. On the surface of this insulation film 2 and substrate exposed portion at opening 3, an amorphous or polycrystalline silicon film 4 for monocrystallizing is formed. At this time, the amorphous or polycrystalline silicon film 4 is formed so that the upper surface of the amorphous or polycrystalline silicon film contacting with the monocrystalline substrate 1 may be flush with the upper surface of the amorphous or polycrystalline silicon film not contacting with the substrate near this contacting portion.

On the surface of this amorphous or polycrystalline silicon film 4, an insulation film 5 made of $SiO_2$, $Si_3N_4$ or similar material is formed, and in the portion containing the opening seed 3 where the polycrystalline silicon film 4 beneath the insulation film 5 on the surface of this insulation film 5 contacts the substrate, a compound film 8 is formed. The compound film 8 is a polycrystalline silicon film 6 to alleviate the thermal stress when annealing, and a high melting point metal film 7 made of molybdenum (Mo), tungsten (W) or other material which is large in electron inhibiting ability and is high in electron reflectivity is formed. At this time, the compound film 8 formed from the high melting point metal film 7 and polycrystalline silicon film 6 is patterned in a belt shape, and this belt width is smaller than the diameter the electron beams, for example, being set in a range of 10 to 20 μm. Moreover, the compound film 8 is patterned so that the position of the opening seed 3 contacting the monocrystalline substrate 1 and amorphous or polycrystalline silicon film 4 may be located beneath the center line of the inside belt-shaped compound film 8 more than 50 to 200 μm remote from the end 8a of the belt-shaped compound film 8 in the scanning direction of energy beams, and the shape of the opening seed 3 is formed narrower than the width of the belt-shaped compound film 8 to be, for example, a spot opening about 2 to 5 μm in diameter.

In this constitution, at both sides of the belt-shaped compound film 8, the electron beams directly heat the polycrystalline silicon film 4, but beneath the belt-shaped compound film 8, since the electron reflectivity and electron inhibiting ability of this compound film 8 are high, the energy of the electron beams is decreased by reflection and is completely absorbed within the belt-shaped compound film 8, and the temperature rises within the belt-shaped compound film 8 and this heat is conducted to heat the polycrystalline silicon film 4. Therefore, the belt-shaped compound film 8 controls the temperature rise of the polycrystalline silicon film 4 to produce a temperature profile lower in the middle part than in the peripheral parts as indicated by curve A in FIG. 4, thereby presenting an optimum temperature profile suited to induce monocrystalline growth at the time of dissolving and recrystallizing.

Since this compound film 8 prevents the electrons from reaching directly near the portion to be monocrystallized, it is effective in decreasing electron beam damage of the monocrystallized film.

Thus, the temperature distribution suited to monocrystallization is presented by the temperature distribution control by the belt-shaped compound film 8. Moreover, since the polycrystalline silicon film 4 contacts the monocrystalline substrate 1 and opening seed 3, monocrystals inheriting the crystalline configuration of the monocrystalline substrate 1 are formed in this part by the epitaxial growth from the monocrystalline substrate 1 at the time of dissolving and recrystallizing, and they become seed crystals for monocrystalline growth of the polycrystalline silicon film 4 beneath the belt-shaped compound film 8, thereby enabling the control of the crystalline configuration.

At this time, since the position of the opening seed 3 contacting the monocrystalline substrate 1 and polycrystalline silicon film 4 is beneath the center line of the belt-shaped compound film 8 at a position of 50 to 200 μm from the end 8a of the belt-shaped compound film 8 in the scanning direction of the energy beams, and its shape is narrower than the width of the belt-shaped compound film 8, for example, about 2 to 5 μm, and also the upper surface of the polycrystalline silicon not contacting the monocrystalline substrate 1 is flush with the upper surface of the polycrystalline silicon in the portion of the opening seed 3, the temperature rise of the polycrystalline silicon in this contacting portion is facilitated at the time of dissolving and recrystallizing, and the temperature difference from the polycrystalline silicon not contacting with the monocrystalline substrate 1 near this contacting portion is reduced. Therefore, if a sufficient energy for dissolving the polycrystalline silicon in the contacting portion is applied, damage due to excessive rise of the temperature of the polycrystalline silicon not contacting the monocrystalline substrate 1 near this contacting portion is prevented, and reduction of the uniformity of crystals derived from such damage may be suppressed at the same time.

Meanwhile, the thickness of the electron beam absorbing compound film 8 is set to such a dimension that it is greater than the range of electrons and is enough to absorb 100% of the energy of the electrons within the film and to suppress peeling of the electron absorbing film 8 due to thermal stress at the time of annealing. When, for example, molybdenum (Mo) is used, if annealing having an electron beams with acceleration voltage of 10 kV is conducted, the range of electrons is considered around 500 nm and the electron inhibiting ability of the polycrystalline silicon is considered to be about 1/5 that of molybdenum, the thickness of the molybdenum is set at 400 to 600 nm and that of polycrystalline silicon film at 500 to 1,000 nm, considering the suppression of molybdenum peeling and the control effect of temperature distribution by heat conduction within the electron beam absorbing film 8.

The insulation film 5 covering the thin film 4 possesses the effect of delaying the heat conduction from the electron absorbing film 8, the effect of preventing damage due to direct entrance of electron beams into the thin film 4, and the effect of preventing contamination due to direct contact with the electron beam absorbing film 8. The thickness of the insulation film 5 is set at 400 to 600 nm in order to lower the temperature beneath the thin film 8 due to heat conduction in the insulation film 5 due to the heat generated by the thin film 8.

Figure 5:
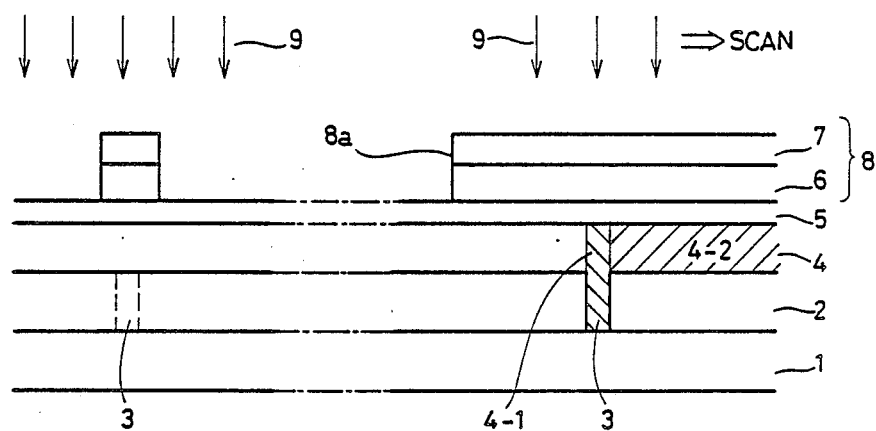
FIG. 5 is a sectional view of the substrate to explain the recrystallization process of the same embodiment as shown in FIG. 3.

FIG. 5 is a sectional view of the substrate to explain the recrystallization process of an embodiment of this invention, in which illustrative sections in orthogonal directions are indicated on the right and left. Therefore, when the beam scanning is done in the rightward direction in the right-side drawing, the beam scanning is done in the direction perpendicular to the paper surface in the left-side drawing.

In FIG. 5, electron beams 9 are emitted to the substrate to the laminate structure so that the center of the electron beams 9 may be located in the middle of the electron beam absorbing film 8 penetrating through the electron beam absorbing film 8, and the electron beams 9 are scanned parallel to the belt-shaped electron beam absorbing film 8, starting from the vicinity of the end 8a of the electron beam absorbing film 8. As a result, first in the part 4-1 of the polycrystalline silicon film 4, monocrystals in the same crystalline configuration as in the monocrystalline substrate 1 are formed by epitaxial growth from the monocrystalline substrate 1, and due to the difference in the heat conduction to the part 4-1 of the polycrystalline silicon film 4 and to the lower part of part 4-2 of the polycrystalline silicon film 4 and the temperature gradient in the horizontal direction occurring due to the scanning of the electron beams 9, the monocrystals formed in the part 4-1 are extended to the part 4-2, thereby forming seed crystals for crystal growth of the part 4-2 of the polycrystalline silicon.

At this time, since the position of part 4-1 (opening seed) is located at a position of about 50 to 200 μm from the end 8a of the electron beam absorbing belt-shaped compound film 8 in the scanning direction, when the electron beams 9 are scanned starting from the vicinity of the end 8a of the electron beam absorbing film 8, the electron beams 9 may reach the part 4-1 only after reaching the thermally stationary state, and also because the part 4-1 is beneath the center line of the electron beam absorbing film 8 and its shape is narrower than the width of the electron beam absorbing film 8, being formed, for example, in a spot of about 2 to 5 μm in diameter, and moreover the upper surface of the part 4-1 is formed to be flush with the upper surface of the part 4-2, the heat capacity of the part 4-1 and its upper part is large and the heat flowing into the monocrystalline substrate 1 having a large heat conductivity becomes smaller, so that the temperature rise of the part 4-1 may be facilitated and the temperature difference between the part 4-1 and part 4-2 is reduced. Therefore, in this state, when a sufficient energy for dissolving the part 4-1 is applied, excessive rise of the temperature of part 4-2 is prevented, and damage to part 4-2 may be avoided, so that a decline of uniformity of crystals due to such a defect may be suppressed.

With regard to the part exposed to the electron beams 9, the portion not covered with the electron beam absorbing film 8 receives the electron beams 5 through the insulation film 5, and the temperature of this portion goes up. On the other hand, in the portion covered with electron beam absorbing film 8, part of the electron beams 9 is reflected, while the remainder is absorbed by the electron beam absorbing film 8, so that the temperature of the electron beam absorbing film 8 goes up, and this heat is conducted to the part 4-2 of the polycrystalline silicon film 5 through the insulation film 5. At this time, immediately beneath the electron beam absorbing film 8, the temperature becomes lower than in the peripheral parts due to energy loss by reflection of electrons by the electron beam absorbing film 8 and temperature drop due to heat conduction in the thin film 8 and insulation film 5, thereby forming a temperature profile suited to monocrystalline growth, being lower in the middle part and higher in the peripheral parts as indicated by curve A in FIG. 4. Thus, monocrystals are formed in the same crystalline configuration as in the monocrystalline substrate 1, starting from the monocrystals in the same crystalline configuration as in the monocrystalline substrate 1 which have been developed by epitaxial growth from the monocrystalline substrate 1 in the part 4-1 of the polycrystalline silicon film 4 and extended toward the part 4-2.

Since the temperature distribution suited to monocrystallization is realized by the electron beam absorbing film 8, the stability of monocrystalline growth starting from the monocrystals of the part 4-2 of the polycrystalline silicon 4 generated in part 4-1 is enhanced as compared with that in the usual lateral seeding epitaxial growth without using electron beam absorbing film 8.

After monocrystallizing by annealing, the electron beam absorbing film 8 and insulation film 5 are removed by etching, and, for example, by photolithography, a monocrystalline region is processed in a shape presented for fabrication of semiconductor element.

Figure 6:
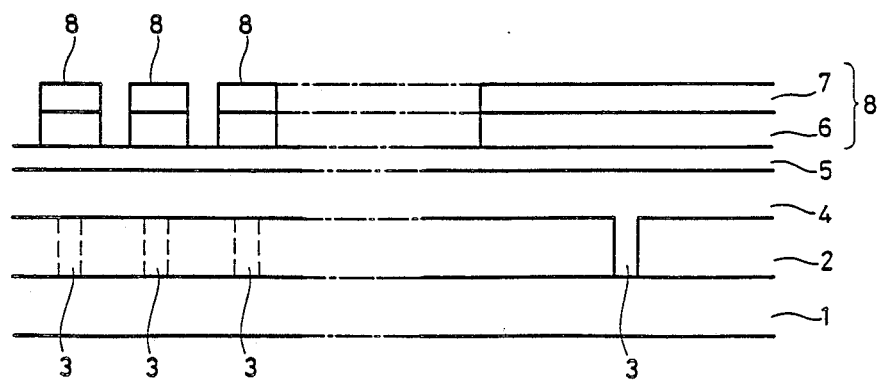
FIG. 6 is a sectional view of the substrate to explain a different embodiment of this invention.

FIG. 6 is a sectional view of the substrate to explain a further different embodiment of this invention, in which the same parts as in FIG. 3 are identified with same part numbers. It shows a substrate structure for producing large-area monocrystals having as nearly the same width as the pseudoline electron beam by annealing with pseudoline electron beams.

In this embodiment, an electron beam absorbing film 8 of a similar belt shape as used in the preceding embodiments is formed in line-and-space shape. At this time, the line is set at about 10 to 20 μm, and the space, about 5 μm. The pseudoline electron beams have an acceleration voltage of 5 to 10 kV, and a beam current of about 1.0 to 5.0 mA, and the spot-shaped electron beams having a gaussian energy distribution of beam diameter of about 100 to 200 μm are formed in an alternating-current voltage waveform such as a triangular wave (the triangular wave frequency about 100 kHz to 50 MHz) by deflecting at a width of about 500 to 2,000 μm in the direction vertical to the scanning direction, so that, in this case, a broad and uniform temperature distribution is realized as indicated by curve B in FIG. 4. Using such pseudoline electron beams, by simultaneously annealing the region containing a plurality of stripes of electron beam absorbing film 8, a plurality of monocrystalline regions are formed. Since the width of the monocrystaline region is extended from the width of the striped high melting point metal film, the monocrystalline regions are linked together when the line and space are set in the above values, and moreover because the crystalline configuration of the monocrystalline regions is same as that of the monocrystalline substrate 1 as in the case shown in FIG. 5, a crystal boundary is not formed between the adjacent monocrystals, so that large-area monocrystals nearly equal in width to the pseudoline electron beams may be formed.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method of manufacturing semiconductor devices, in which a monocrystalline thin film is formed by dissolving and recrystallizing amorphous or polycrystalline thin film by annealing with energy beams, comprising the steps of:

forming a monocrystalline substrate;
forming a first insulation film on said substrate;
forming an amorphous or polycrystalline thin film on said first insulation film, wherein said thin film is formed so as to contact said substrate through a contact opening means in said first insulation film;
forming a second insulation film on said thin film;
forming a compound film having a belt shape with at least a first end and a width narrower than the diameter of said energy beams on said second insulation film, wherein said compound film comprises a high melting point metal film formed o polycrystalline silicon, and wherein said contact opening is formed beneath the center line of said compound film at a position of more than 50 to 200 microns distant from said first end of said compound film along the scanning direction of said energy beams, said contact opening being narrower in width than the width of said compound film;
beams scanning in parallel with said compound film by means of radiating energy beams so as to penetrate through said compound film, wherein said beam scanning starts from the vicinity of said first end of said compound film; and
inducing monocrystalline growth of said amorphous or polycrystalline thin film covered by said compound film, wherein said monocrystalline growth starts near said contact opening and said thin film inherits the crystalline configuration of said monocrystalline substrate by epitaxial growth from said substrate.

2. A method of manufacturing semiconductor devices as defined in claim 1, wherein said thin film has a first surface adjacent to said first insulation film and a second surface adjacent to said second insulation film, the portion of said second surface of said thin film above said contact opening being flush with the rest of said second surface of said thin film.

3. A method of manufacturing semiconductor devices as defined in claim 1 or 2, wherein the radiating energy beams to be used are spot electron beams having a gaussian energy distribution, or pseudoline electron beams formed by deflecting and scanning spot electron beams at high speed by applying an alternating-current voltage in a triangular wave vertical to the scanning direction of said spot electron beams.

4. A method of manufacturing semiconductor devices as defined in claim 3, wherein said spot electron beams have an acceleration voltage of about 5 to 20 kV, and a beam diameter of about 100 to 200 micron.

5. A method of manufacturing semiconductor devices, as defined in claim 4, wherein the width of said high melting point metal film of said belt-shaped compound film is about 10 to 20 microns when annealing is conducted with spot electron beams, and wherein a plurality of belt-shaped compound films having width of about 10 to 20 microns are formed in a pattern so as to be spaced apart from each other by about 5 microns when annealing is conducted with pseudoline electron beams.

6. A method of manufacturing semiconductor devices as defined in claim 3, wherein said pseudoline electron beams have an acceleration voltage of about 5 to 20 kV, and are formed from spot electron beams having a beam diameter of about 100 to 200 which are deflected to a width of about 500 to 2,000 microns.

7. A method of manufacturing semiconductor devices as defined in claim 6, wherein the width of said high melting point metal film of said belt-shaped compound film is about 10 to 20 microns when annealing is conducted with spot electron beams, and wherein a plurality of belt-shaped compound films having width of about 10 to 20 microns are formed in a pattern so as to be spaced apart from each other by about 5 microns when annealing is conducted with pseudoline electron beams.

8. A method of manufacturing semiconductor devices as defined in claim 5, wherein said first and second insulation films comprise $SiO_2$ or $Si_3N_4$, said monocrystalline substrate and said amorphous or polycrystalline thin film comprise silicon, and said high melting point metal film comprises molybdenum or tungsten.

9. A method of manufacturing semiconductor devices as defined in claim 7, wherein said first and second insulation films comprise $SiO_2$ or $Si_3N_4$, said monocrystalline substrate and said amorphous or polycrystalline thin film comprise silicon, and said high melting point metal film comprises molybdenum or tungsten.

10. A method of manufacturing semiconductor devices as defined in claim 8, wherein said contact opening means is about 2 to 5 microns in diameter.

11. A method of manufacturing semiconductor devices as defined in claim 9, wherein said contact opening means is about 2 to 5 microns in diameter.

12. A method of manufacturing semiconductor devices as defined in claim 10, wherein said high melting point metal comprises molybdenum having a thickness of from 400 to 600 nm, said polycrystalline silicon of said belt-shaped compound film has a thickness of from 500 to 1,000 nm, and said second insulation film has a thickness of from 400 to 600 nm.

13. A method of manufacturing semiconductor devices as defined in claim 11, wherein said high melting point metal comprises molybdenum having a thickness of from 400 to 600 nm, said polycrystalline silicon of said belt-shaped compound film has a thickness of from 500 to 1,000 nm, and said second insulation film has a thickness of from 400 to 600 nm.

* * * * *